United States Patent
Bandyopadhyay et al.

(10) Patent No.: US 8,847,807 B2
(45) Date of Patent: Sep. 30, 2014

(54) SWITCHING SCHEME FOR ISI MITIGATION IN DATA CONVERTERS

(71) Applicants: Abhishek Bandyopadhyay, Burlington, MA (US); Paul A. Baginski, Methuen, MA (US)

(72) Inventors: Abhishek Bandyopadhyay, Burlington, MA (US); Paul A. Baginski, Methuen, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/790,472

(22) Filed: Mar. 8, 2013

(65) Prior Publication Data

US 2014/0145867 A1      May 29, 2014

Related U.S. Application Data

(60) Provisional application No. 61/729,799, filed on Nov. 26, 2012.

(51) Int. Cl.
    *H03M 1/66*      (2006.01)
    *H03K 17/06*      (2006.01)

(52) U.S. Cl.
    CPC .................................. *H03K 17/063* (2013.01); *H03M 1/664* (2013.01)
    USPC ............................. 341/144; 341/118; 330/251

(58) Field of Classification Search
    CPC ............. H03M 2201/3194; H03M 2201/3136; H03M 1/3136; H03M 1/682; H03K 17/063
    USPC .................. 341/144, 135, 118; 330/251, 207
    See application file for complete search history.

(56) References Cited

U.S. PATENT DOCUMENTS

| | | | | |
|---|---|---|---|---|
| 4,551,709 | A  * | 11/1985 | Merchant et al. | 341/136 |
| 5,574,455 | A  * | 11/1996 | Hori et al. | 341/144 |
| 6,061,010 | A    | 5/2000  | Adams et al. | |
| 6,555,996 | B2 * | 4/2003  | Drori et al. | 323/369 |
| 6,812,879 | B2 * | 11/2004 | Suwa et al. | 341/144 |
| 7,079,063 | B1   | 7/2006  | Nguyen et al. | |
| 7,256,721 | B2 * | 8/2007  | Copley | 341/144 |
| 7,307,568 | B1   | 12/2007 | Nguyen | |
| 7,551,028 | B1 * | 6/2009  | Cyrusian | 330/251 |
| 8,456,341 | B2 * | 6/2013  | Hezar et al. | 341/144 |

OTHER PUBLICATIONS

Kohno et al., "A 350-MS/s 3.3-V 8-bit CMOS D/A Converter using a Delayed Driving Scheme," Proceedings of the 1995 IEEE Custom Integrated Circuits Conference, pp. 211-214, May 1995.
Schofield et al., "A 16b 400MS/s DAC with <-80dBc IMD to 300MHz and <-160dBm/Hz Noise Power Spectral Density," 2003 IEEE International Solid-State Circuits Conference (ISSCC 2003) Digest of Technical Papers, pp. 126, 482-490.

* cited by examiner

*Primary Examiner* — Peguy Jean Pierre
(74) *Attorney, Agent, or Firm* — Kenyon & Kenyon LLP

(57) ABSTRACT

Embodiments of the present disclosure may provide a switching scheme for tri-level unit elements with ISI mitigation. A tri-level unit element may include a first and second current source and a plurality of switches arranged to form three circuit branches between the first and the second current source. The first circuit branch may include two switches connected in parallel between the first current source and a first output terminal and two switches connected in parallel between the second current source and the first output terminal. The second circuit branch may include two switches connected in parallel between the first current source and a second output terminal and two switches connected in parallel between the second current source and the second output terminal. The third circuit branch may include switches to couple the first current source and the second current source to a dump node.

28 Claims, 6 Drawing Sheets

SWITCHING SCHEME FOR ISI MITIGATION IN DATA CONVERTERS

CROSS-REFERENCE TO RELATED APPLICATION

This application claims the benefit of priority afforded by U.S. Provisional Application Ser. No. 61/729,799, filed Nov. 26, 2012, the entirety of which is incorporated by reference herein.

BACKGROUND

The subject matter of this application is directed to switching schemes for unit elements in digital to analog converters (DACs), and more particularly to switching schemes for tri-level unit elements that mitigates intersymbol interference (ISI).

Digital to analog converters (DACs) receive a digital input signal and provide an analog output signal (e.g., current, voltage or electric charge) representing the digital signal. For simplicity and flexibility, current steering architectures may be used in DACs. In one design, the DAC includes multiple two-level current steering unit elements (e.g., 1-bit DAC). One unit element can be provided for each quantization level of the digital input signal. Depending on the value of the digital input signal, switches are operated to control the contribution of each unit element to provide a positive current or a negative current to the output signal. The outputs of the unit elements are combined to provide an analog output signal representing the digital input signal.

In another design, tri-level current steering unit elements are used to provide the analog output signal. Each tri-level unit element can include a pair of current sources (positive and negative) for each quantization level of the digital input signal. Depending on the value of the digital input signal, each tri-element unit element provides either a positive current, a negative current or no current to the output signal. Tri-level unit elements in DACs provide noise and power advantages over the more conventional two-level unit elements, where all the unit elements are always connected to the output.

One of the sources of error in DACs is intersymbol interference (ISI). ISI is a form of distortion in which symbols of the digital signal interfere with subsequent symbols. ISI may be present when noise on the outputs depends on switching activity of the circuit elements, which depend on information content of the signals passing through the circuit. In a DAC, ISI occurs when the output for a particular clock period is a function not only of the digital input signal applied to the DAC for that clock period, but also a function of the digital input signal applied for the preceding clock periods. In particular, the ISI is the result of unequal rise and fall times in the waveforms of the current delivered to the output by each unit element.

FIG. 1 illustrates a circuit for a switching scheme to control current sources in a tri-level unit element. The tri-level unit element 100 may include outputs 110, 120, current sources 130, 140, a current dump node 150 and six switches A, B, C, D, E and F. The switches A, B, C, D, E and F may be controlled to provide three states of operation for the unit element 100 by coupling the current sources 130, 140 to one of the outputs 110, 120 and the current dump node 150. The switches may be controlled based on the digital input signal (not shown in FIG. 1). In a first state, the unit element 100 may provide current to the output 110 and drain current from the output 120. In the second state, the unit element 100 may provide current to the output 120 and drain current from the output 110. In the third state, the unit element 100 may be inert by neither supplying current to nor draining current from either output terminal 110, 120 (i.e., coupling the current sources 130, 140 to the current dump node 150).

In FIG. 1, ISI may be caused by the drain capacitance of the current sources 130, 140 and/or the capacitance at the sources of the switches A, B, C, D, E and F, and the associated feed through to this capacitance due to the switching of the current sources 130, 140. ISI may also be caused when the current sources 130, 140 that have not been used for some time, are subsequently chosen to be used. Thus, the output at a particular clock period becomes a function not only of the digital input signal for the current clock period, but also a function of the digital input signal applied for one or more preceding clock periods.

Several techniques have been proposed to mitigate ISI. For example, delayed driving schemes of the switches controlling the current sources have been used to maintain a crossing point of the switches' gate drive relative to the switching threshold. However, the delayed driving schemes do not track well with process, voltage and/or temperature variations. Another proposed solution is a return to zero technique, where the output of each unit element is forced to start from zero, reach its final value, and return to zero within a single clock period. However, this technique introduces large steps into the output which may increase the slew rate and bandwidth requirements for a subsequent circuit stage (e.g., an amplifier). Duel return to zero techniques were proposed to overcome the disadvantages of the return to zero technique, where for each bit clock period, two or more return to zero signals are generated for each input bit. However, this technique significantly increases the silicon area and consumes more power. To overcome the disadvantages of the duel return to zero technique, a return to hold technique was proposed. The return to hold technique includes two phases. The first phase is a hold phase involving a disconnecting and updating the current sources to allow them to settle. The second phase involves connecting the current sources to the outputs after the current sources are settled. However, with increased operating frequencies, the return to hold technique has trouble settling with a smaller hold phase.

Accordingly, there is a need in the art for a switching scheme to control tri-level unit element and mitigate ISI while allowing for higher frequency operation.

BRIEF DESCRIPTION OF THE DRAWINGS

So that features of the present invention can be understood, a number of drawings are described below. It is to be noted, however, that the appended drawings illustrate only particular embodiments of the disclosure and are therefore not to be considered limiting of its scope, for the invention may encompass other equally effective embodiments.

DETAILED DESCRIPTION

Embodiments of the present disclosure may provide a switching scheme for tri-level unit elements with ISI mitigation. The embodiments may include using a duel-switch scheme for each output to control the current sources in the tri-level unit elements.

In one embodiment, a tri-level unit element may include a first and second current source and a plurality of switches arranged to form three circuit branches between the first and the second current source. The first circuit branch may include two switches connected in parallel between the first current source and a first output terminal and two switches connected in parallel between the second current source and the first output terminal. The second circuit branch may include two switches connected in parallel between the first current source and a second output terminal and two switches connected in parallel between the second current source and the second output terminal. The third circuit branch may include switches to couple the first current source and the second current source to a dump node. The current sources may be coupled to the respective outputs to provide one of a positive state, a negative state and an inert state. In a consecutive clock cycle, if the same current sources are coupled to the respective outputs, a different set of switches may be activated in the consecutive clock cycle.

Figure 1:
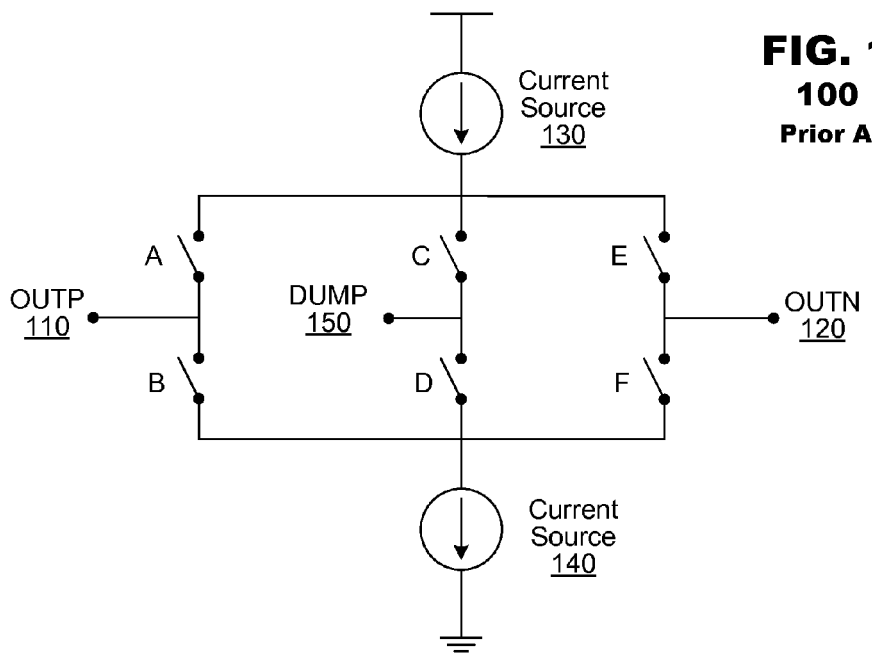
FIG. 1 illustrates a circuit for a switching scheme to control current sources in a tri-level unit element.

To mitigate ISI in a tri-level unit element shown in FIG. 1, complementary switches may be included in parallel with one or more of the switches A, B, C, D, E and F. These switches may be operated to remove the data dependence of the unit cell by providing a baseline of switching activity within the unit cell regardless of the content from which the control signals are generated.

Figure 2:
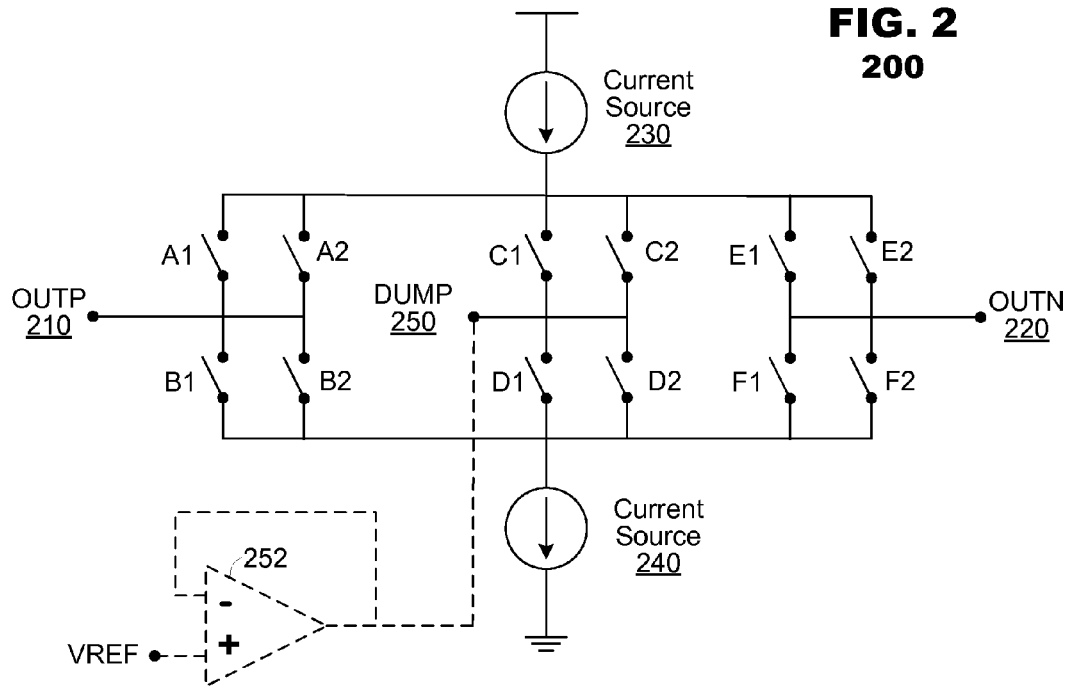
FIG. 2 illustrates a circuit for a switching scheme to control current sources in a tri-level unit element according to an embodiment of the present invention.

FIG. 2 illustrates a switch scheme to control current sources in a tri-level unit element 200 according to an embodiment of the present invention. The tri-level unit element 200 may include a plurality of switches A1, A2, B1, B2, C1, C2, D1, D2, E1, E2, F1, and F2, a pair of output terminals 210 and 220, and a pair of current sources 230 and 240. The switches may establish three circuit branches between each current source 230, 240. Switches A1, A2, B1 and B2 may define a first branch, established between the first current source 230, the first output terminal 210 and the second current source 240. Switches E1, E2, F1 and F2 may define a second branch, established between the first current source 230, the second output terminal 220 and the second current source 240. Switches C1, C2, D1 and D2 may define a third branch through the unit element 200 that is not connected to either of the output terminals.

Table 1 illustrates switching that may occur during operation of the unit cell 200 to provide current or drain current from the output terminals 210, 220. There are three major states of operation for the unit cell: 1) the cell 200 provides current to the first terminal 210 and drains current from the second terminal 220, 2) the cell 200 drains current from the first terminal 210 and supplies current to the second terminal 220, and 3) the cell 200 is inert—it neither supplies current to nor drains current from either output terminal 210, 220. The first state may correspond to a negative state (e.g., current provided to the output 210 and current drained from the output 220). The second state may correspond to a positive state (e.g., current provided to the output 220 and current drained from the output 210). The third state may correspond to an inert state in which no current is provided at the outputs 210, 220. The definitions of the states discussed above are discussed with reference to the embodiment shown in FIG. 2, but may be defined differently in other embodiments.

TABLE 1

| | ADD CURRENT TO TERMINAL 210/DRAIN CURRENT FROM TERMINAL 220 | | DRAIN CURRENT FROM TERMINAL 210/ADD CURRENT TO TERMINAL 220 | | DUMP CURRENT | |
|---|---|---|---|---|---|---|
| | PHASE 1 | PHASE 2 | PHASE 1 | PHASE 2 | PHASE 1 | PHASE 2 |
| A1 | Closed | Open | Open | Open | Open | Open |
| A2 | Open | Closed | Open | Open | Open | Open |
| B1 | Open | Open | Closed | Open | Open | Open |
| B2 | Open | Open | Open | Closed | Open | Open |
| C1 | Open | Open | Open | Open | Closed | Open |
| C2 | Open | Open | Open | Open | Open | Closed |
| D1 | Open | Open | Open | Open | Closed | Open |
| D2 | Open | Open | Open | Open | Open | Closed |
| E1 | Open | Open | Open | Closed | Open | Open |
| E2 | Open | Open | Closed | Open | Open | Open |
| F1 | Open | Closed | Open | Open | Open | Open |
| F2 | Closed | Open | Open | Open | Open | Open |

During operation, only one switch in the first and second branch may be closed at a time. Thus, if switch A1 were closed to connect the output terminal 210 to the first current source 230, the switches A2, B1 and B2 each may be open. Similarly, if switch F1 were closed to connect the second output terminal 220 to the second current source 240, the other switches E1, E2 and F2 in the second branch may be opened. In the third branch, two switches may be closed at one time to connect the dump node 250 to the current sources 230, 240.

Activation of the switches in the first and second branches may be operated in complementary fashion. When a switch in one branch (say, A1) closes to connect the first current source 230 to one of the output terminal 210, no other switches that are connected to the first current source 230 may be closed. When the first switch A1 is closed, a switch (say F2) in the other branch will close to connect the other output terminal 220 to the second current source 240.

Activation of two switches in the third branch may operate synchronously. For example, switches C1 and D1 may open and close together to establish and/or deconstruct a conductive path between the first and second current sources 230, 240 that bypass both of the output terminals 210, 220. Similarly, switches C2 and D2 may open and close together to establish and/or deconstruct a conductive path between the first and second current sources 230, 240 that bypass both of the output terminals 210, 220. Thus, activation of the switches C1 and C2 may operate in complementary fashion, and the activation of the switches D1 and D2 may operate in complementary fashion to establish a conductive path between the first and second current sources 230, 240 and the dump node 250.

The switching table merely illustrates an example of the principles of the present invention. Other embodiments are permissible. For example, where switches A1 and F2 are shown as being partnered in the first column of Table 1 and switches A2 and F1 are shown as partners in the second column, switch A1 could be partnered with switch F1 and switch A2 could be partnered with switch F2. Such implementation variations are immaterial to the operation of the unit cell 200 unless described hereinbelow.

The embodiment of FIG. 2 mitigates against input referred noise by providing a baseline of switching activity within the unit cell regardless of the content from which the control signals are generated. When, for example, control signals applied to the unit cell 200 causes current from current source 230 to be switched from output terminal 210 to the second output terminal 220, the unit cell 200 may contribute a certain amount of noise to the output signal associated with opening of switches A1 or A2 in the first branch and closing of a switch E1 or E2 in the second branch. When control signals applied to the unit cell 200 causes current from current source 230 to remain applied to the output terminal 210 from one symbol period to the next, the unit cell 200 may open a first one of the switches (say, A1) that delivered current to the output terminal and close the second switch A2 that couples the first current source 230 to the output terminal 210. This opening of switch A1 and closing of switch A2 may generate a certain amount of noise into the output signal much like the switch activity that might occur in the above case, where switch A1 opened and switch E1 closed. In this manner, generally similar noise effects will occur between symbol periods regardless of the content of the signals that generate the switch control signals to switches A1, A2, B1, B2, C1, C2, D1, D2, E1, E2, F1, and F2.

The tri-level unit element 200 may include a buffer amplifier 252 coupled to the current source dump 250. When the cell is inert, the first current source 230 and the second current source 240 may be coupled via switches C1, C2, D1, and/or D2 to the buffer amplifier 252 to maintain their proper drain voltage.

The plurality of switches A1, A2, B1, B2, C1, C2, D1, D2, E1, E2, F1, and F2, which may be a MOS transistor (e.g., NMOS, PMOS or low voltage NMOS, but are not so limited), may control the contribution of the current sources 230 and 240 to the outputs 210, 220 of the unit element 200. The switches may be controlled based on the digital input signal (not shown in FIG. 2) for the current clock cycle and digital input signal for the one or more preceding clock cycles. The switches of the tri-level unit element 200 are controlled to provide positive state, negative state or inert state at the outputs 210, 220.

Depending on the state of the unit cell 200, the switches A1, A2, B1, B2, C1, C2, D1, D2, E1, E2, F1, and F2 may be controlled to provide an analog signal at outputs 210, 220. The control signals applied to the switches may be based on the value of the digital input signal. Mitigating for ISI may include using different combination of switches to provide the analog output at each phase. Different set of switches may be activated at each phase even when the state (e.g., value of output) of the tri-level unit element 200 is not changed from a preceding state.

The current sources 230 and 240 may be MOSFET current sources. In one embodiment, the current source 230 may be a PMOS current source and the current source 240 may be an NMOS current source. In another embodiment, the current sources 230 and 240 may be a bipolar current source.

When the state of the tri-level unit element 200 changes in a subsequent clock cycle (a negative state to an inert state; a negative state to a positive state; a positive state to a negative state; a positive state to an inert state; an inert state to a positive state; or an inert to a negative stat), the appropriate switches are activated and deactivated by a driver circuit (not shown in FIG. 2) to connect the first and second current sources 230 and 240 to the corresponding outputs 210, 220 or the current source dump 250. When the state of the tri-level unit element 200 does not change in a subsequent clock cycle (a positive state to a positive state; an inert state to an inert state; or a negative stage to a negative state), one option is to keep the same switches activated and deactivated. However, keeping the same switches activated and deactivated in subsequent clock cycles may cause ISI. The ISI may be caused by the drain capacitance of the current sources and/or the capacitance at the sources of the switches, and the associated feed through to this capacitance due to the switching of the current sources. This capacitance may be present irrespective of what device is used for the current sources and the switches. ISI may also be caused when a current source that has not been used for some time, is subsequently chosen to be used.

To mitigate ISI, the switches that are activated to couple the first and second current source 230 and 240 to the corresponding outputs 210, 220 or the current source dump 250, are changed at each phase even if the state of the tri-level unit element 200 does not change in a subsequent phase. For example, as shown in Table 1, switch A1 may be activated to couple the first current source 230 to the output 210 (while switch A2 is deactivated) in the first phase and in the next phase, switch A2 may be activated to couple the first current source 230 to the output 210 (while switch A1 is deactivated).

Thus, for at each phase, either the current sources which are coupled to the outputs are switched, due to the changing state of the tri-level unit element 200, or the activated switches are changed to couple the same current sources to the same outputs via a different path using different switches, when the state of the tri-level unit element 200 remains the same in a subsequent phase. Because the switch source capacitance sees the same disturbance irrespective of the transition state of the current sources, the data dependence of the kickback is removed, thus, mitigating for ISI.

In another embodiment, one or more of the switches A2, B2, C2, D2, E2, and/or F2 may be removed from the tri-level unit element 200. For example, switches C2 and D2 shown in FIG. 2 may be omitted from the tri-level unit element 200. Thus, only one path for the current may be provided between each current source 230, 240 and the current dump node 250.

Figure 3A:
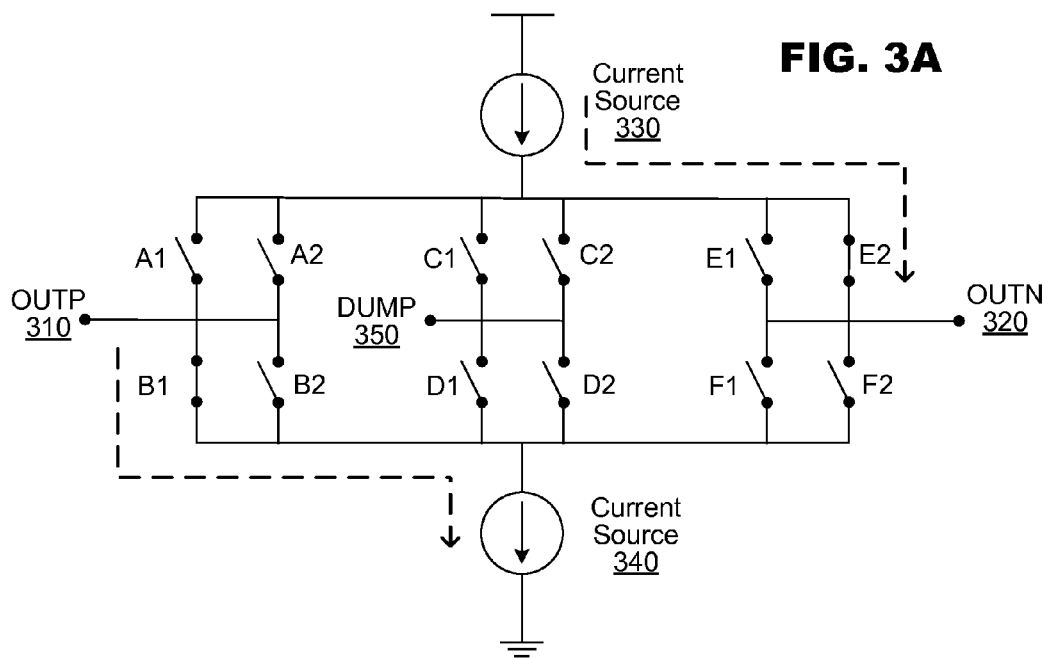
FIGS. 3A and 3B illustrate a switching scheme according to an embodiment of the present invention when the state of a tri-level unit element is changed.
Figure 3B:
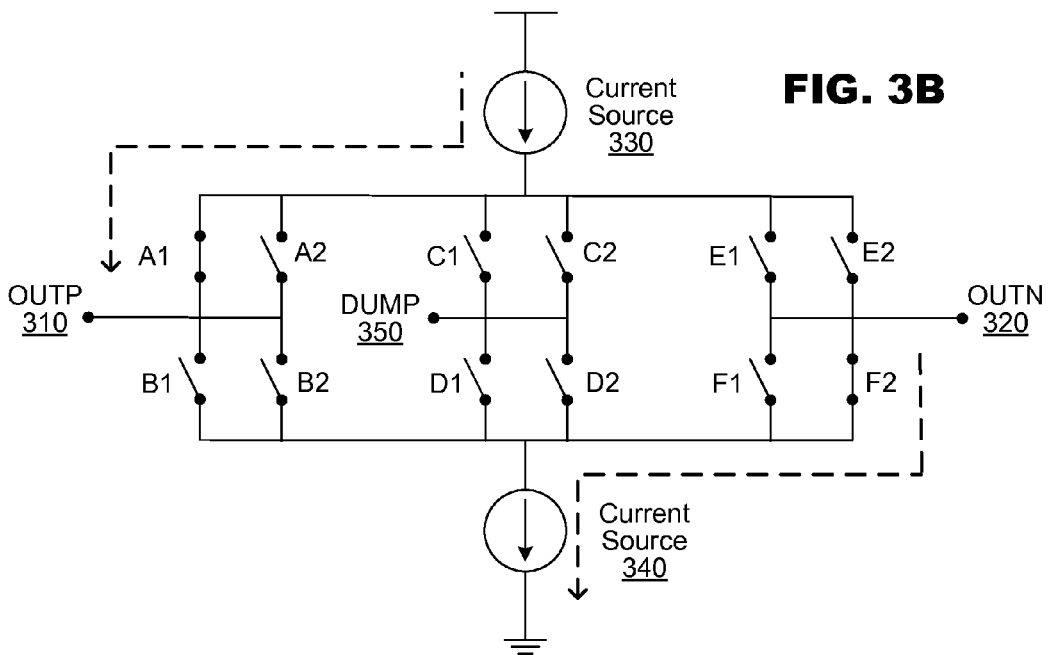

FIGS. 3A and 3B illustrate a switching scheme according to an embodiment of the present invention when the state of a tri-level unit element is changed in a subsequent phase. The coupling of the first and second current sources 330 and 340 to the outputs 310 and 320, are switched at each phase of the clock signal in accordance with the change in state of the tri-level unit element.

FIG. 3A illustrates a possible switch control configuration to provide a positive state of the unit element in a first phase. As shown in FIG. 3A, switch B1 may be activated to couple the second current source 340 to the output 310, switch E2 may be activated to couple the first current source 330 to the negative output 320, and the remaining switches may be deactivated (open). The path of the current flow from the first current source 330 and the path of the current flow from the second current source 340 is shown in FIG. 3A.

FIG. 3B illustrates a possible switch control configuration to provide a negative state of the unit element in a second phase. As shown in FIG. 3B, switch A1 may be activated to couple the first current source 330 to the positive output 310, switch F2 may be activated to couple the second current source 330 to the negative output 320, and the remaining switches may be deactivated (open). The path of the current flow from the first current source 330 and the path of the current flow from the second current source 340 is shown in FIG. 3B.

Figure 4A:
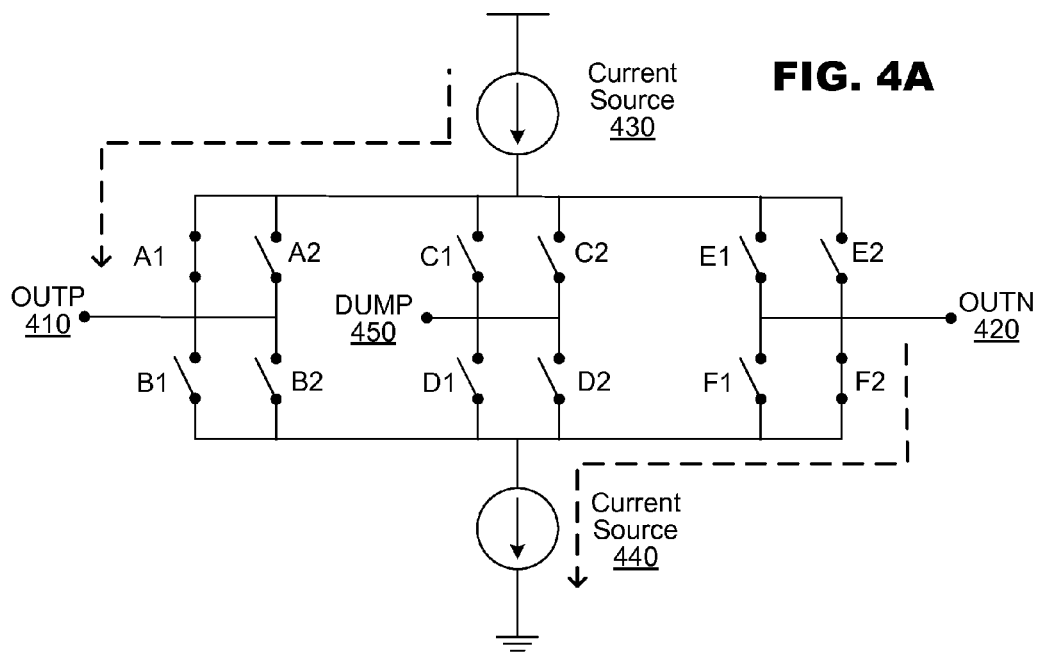
FIGS. 4A and 4B illustrate a switching scheme according to an embodiment of the present invention when the state of a tri-level unit element is not changed.
Figure 4B:
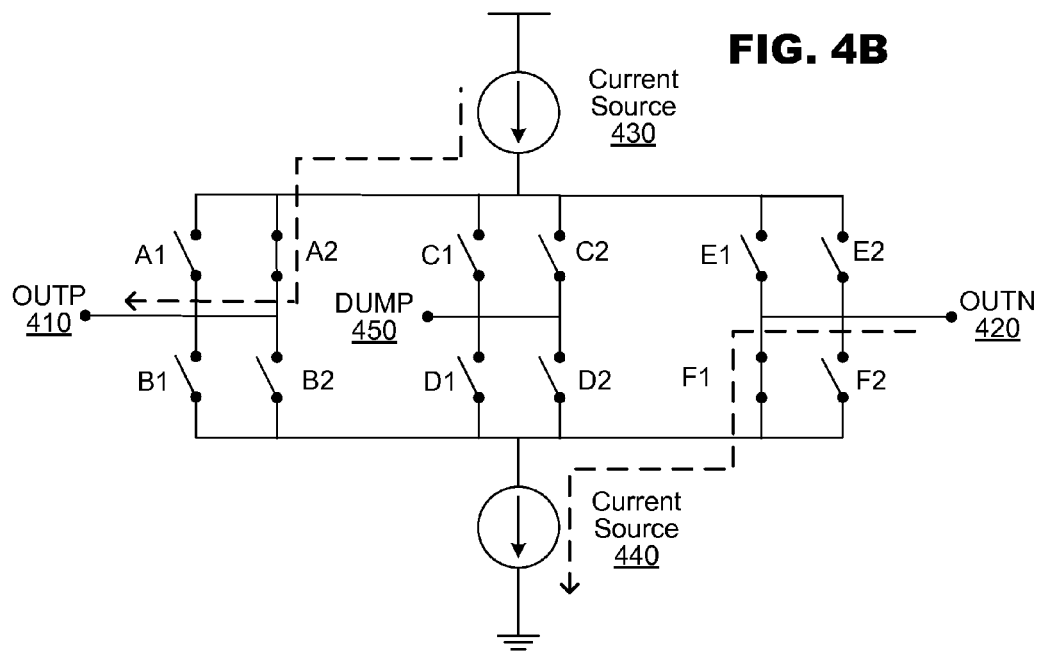

FIGS. 4A and 4B illustrate a switching scheme according to an embodiment of the present invention when the state of a tri-level unit element is not changed in a subsequent phase. While the coupling of the first and second current sources 430 and 440 to the positive and negative outputs 410 and 420 may stay the same, because the state of the tri-level unit element is not changed in the subsequent phase, the switches are operated such that the path of the current and the switch in the path of the current, from the current source to the respective output, is changed.

FIG. 4A illustrates a possible switch control configuration to provide a negative state of the unit element in a first phase of the clock signal. As shown in FIG. 4A, switch A1 may be activated to couple the first current source 430 to the output 410, switch F2 may be activated to couple the second current source 440 to the output 420, and the remaining switches may be deactivated (open). The path of the current flow from the first current source 430 and the path of the current flow from the second current source 440 is shown in FIG. 4A.

FIG. 4B illustrates another possible switch control configuration to provide a negative state of the unit element in a second phase. As shown in FIG. 4B, switch A2 may be activated to couple the first current source 430 to the output 410, switch F1 may be activated to couple the second current source 430 to the output 420, and the remaining switches may be deactivated (open). The path of the current flow from the first current source 430 and the path of the current flow from the second current source 440 is shown in FIG. 4B.

As shown in FIGS. 4A and 4B, while the current sources are coupled to the same output nodes in different phases to provide the same state at the outputs, the paths of the current from the current sources to the outputs are changed. Thus, even though there is no transition in the state of the tri-level unit element, the paths of the currents and the switches in the paths are changed at each phase. Because at each phase either the current source which is coupled to the output is changed, as shown in FIGS. 3A and 3B, or the path of the current to the output nodes is changed, as shown in FIGS. 4A and 4B, the data dependence of the kickback is removed, thus, mitigating for ISI.

Although in FIGS. 4A and 4B multiple switches are controlled to change the path of both currents to the respective output, the switches may be controlled to change only one of the paths of the current flow. For example, in FIG. 4B, switch F2 may remain activated (closed) while switch F1 is deactivated (open), as shown in FIG. 4A. In another embodiment, both switches F1 and F2 may be closed in the second phase shown in FIG. 4B.

Figure 5:
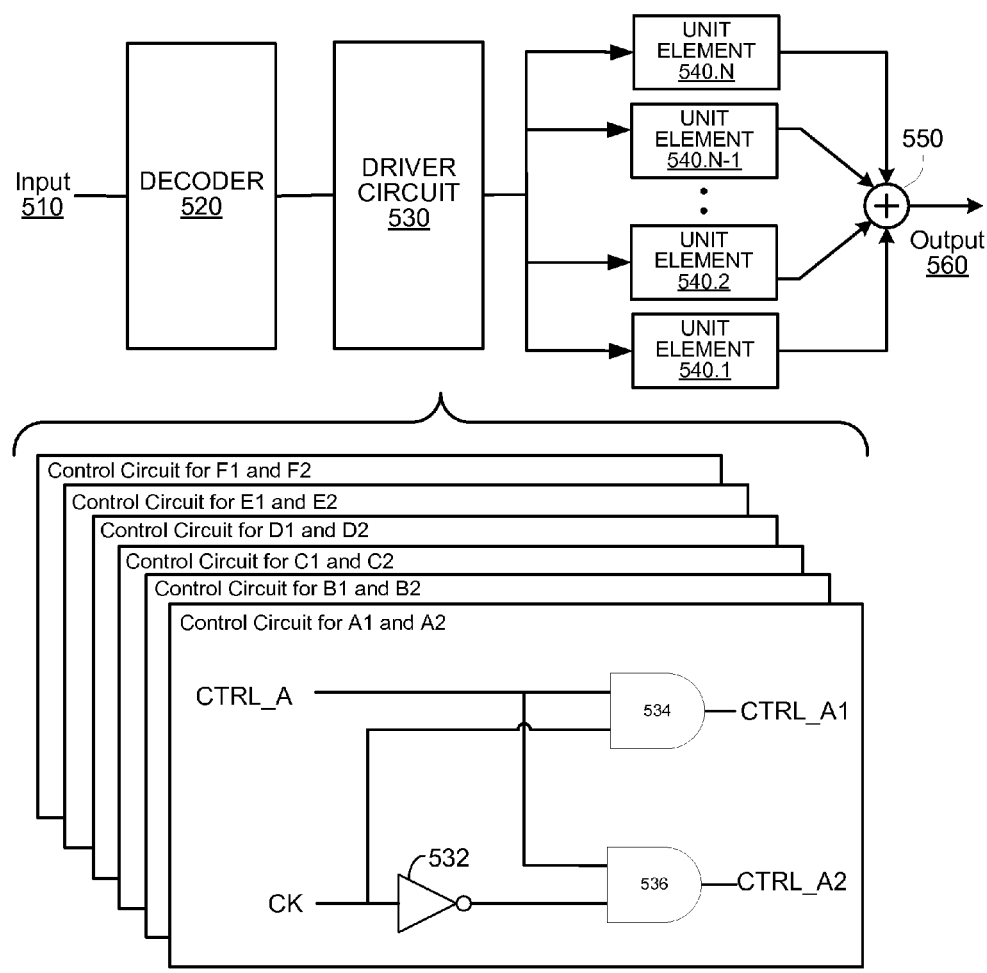
FIG. 5 illustrates a block diagram of a DAC according to an embodiment of the present invention.

FIG. 5 illustrates a block diagram of a DAC according to an embodiment of the present invention. The circuit 500 may include a decoder 520, a driver circuit 530, a plurality of unit elements 540.1-N and an adder 550. The decoder 520 may decode the digital input signal 510 and provide control signals to the driver circuit 530. The driver circuit 530 may control the operation of the unit elements 540 based on the control signals received from the decoder 520. The outputs of each of the unit elements 540.1-N may be combined via adder 550 to provide an analog output signal 550 representative of the digital input signal 510.

The plurality of unit elements 540.1-N may be identical unit elements (e.g., tri-level current steering unit elements providing a positive state, a negative state or inert state at the outputs). Alternatively, the plurality of unit elements 540.1-N may be weighted cells, where each of the weighted cell 540.1-N may provide a different value of current. In another embodiment, a hybrid system may include both identical unit elements and weighted cells. In a hybrid system, the most significant bits may be provided to the identical unit elements and the least significant bits may be provided to the weighted cells.

The driver circuit 530 may include circuitry to control the switches in each of the unit elements 540.1-N based on the input signal and a clock. The driver circuit 530 may include a control circuit for each of the pair of switches (e.g., A1 and A2; B1 and B2; C1 and C2; D1 and D2; E1 and E2; or F1 and F2). Each control circuit may include an inverter 532 and a pair of AND gates 534, 536.

The control circuit for each of the pair of switches may receive a clock signal CK and a control signal CTRL. The clock signal CK and the control signal CTRL may be supplied to the inputs of the first AND gate 534 to provide a control signal CTRL_A1 to the switch A1. Similarly, the inverted clock signal CK via inverter 532 and the control signal CTRL may be supplied to the inputs of the second AND gate 536 to provide a control signal CTRL_A2 to the switch A2. When the control signal CTRL is high, one of the switches A1 or A2 will be activated depending on the phase of the clock CK.

Figure 6:
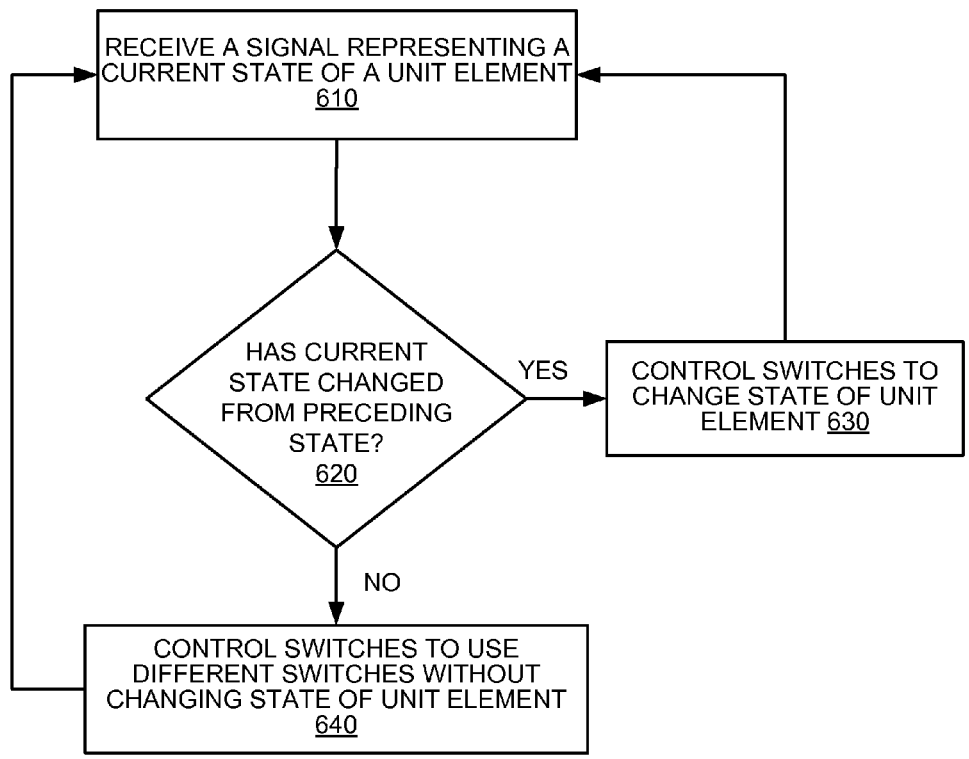
FIG. 6 illustrates a method to mitigate ISI in a tri-level unit element according to an embodiment of the present invention.

FIG. 6 illustrates a method 600 to mitigate ISI in a tri-level unit element according to an embodiment of the present invention. The method 600 to mitigate ISI may be applied on a unit element using a duel-switch scheme for each output shown in FIG. 2. The switches may be operated to control a unit element to provide a positive state, a negative state or inert state at the output. The method 600 may be applied to a DAC having a plurality of unit elements (e.g., DAC shown in FIG. 5).

The method 600 may include receiving a signal representing a current state of the unit element (block 610), comparing the current state to a preceding state of the unit element (block 620), if it is determined that the state is changed, controlling the switches to change the state of the unit element (block 630), if it is determined that the state has not changed, controlling the switches to use different switches without changing the state of the unit element (block 640).

Receiving the signal representing a current state of the unit element (block 610) may include receiving a multi-bit signal (e.g., two-bit signal) representing one of three states levels of the unit element (e.g., negative state, positive state and inert state). The unit element may be configured to provide positive state, negative state or inert state as the output signal. The current state of the unit element may be compared to the state of a preceding state of the unit element (block 620) to determine if the state of the unit element needs to be changed. The preceding state of the unit element may be a state of the unit element at a preceding phase of the clock.

If it is determined that the state is changed, one or more of the switches used to control the unit element may be switched to provide the different state (block 630). Operating the switches to provide a different state may include changing the direction of the current provided by the one or more current sources or coupling the current sources to a dump node. The dump node may be coupled to a buffer amplifier to maintain proper drain voltage of the current sources.

If it is determined that the state has not changed, one or more switches used to control the unit element may be switched, while maintaining the same state of the unit element (block 640). The same state of the unit element may be maintained while changing the switches if multiple switches are included between each current source and the outputs. The same state can be provided via different switches by the switches providing a different path for the current from each of the current sources to the respective output and/or a dump node.

The method 600 allows a different set of switches to be used to provide the state of the tri-level unit element at each clock cycle or phase of the clock. Different switches may be used to provide the state of the tri-level unit element even if the state is not changed. Changing the switches at each clock cycle or phase of the clock, allows for the data dependence of the kickback to be removed, thus, mitigating for ISI.

The above discussed embodiments to mitigate ISI may be applied on other circuits. For example, embodiments discussed above may be applied to circuits having a single output and/or a single current source.

Figure 7:
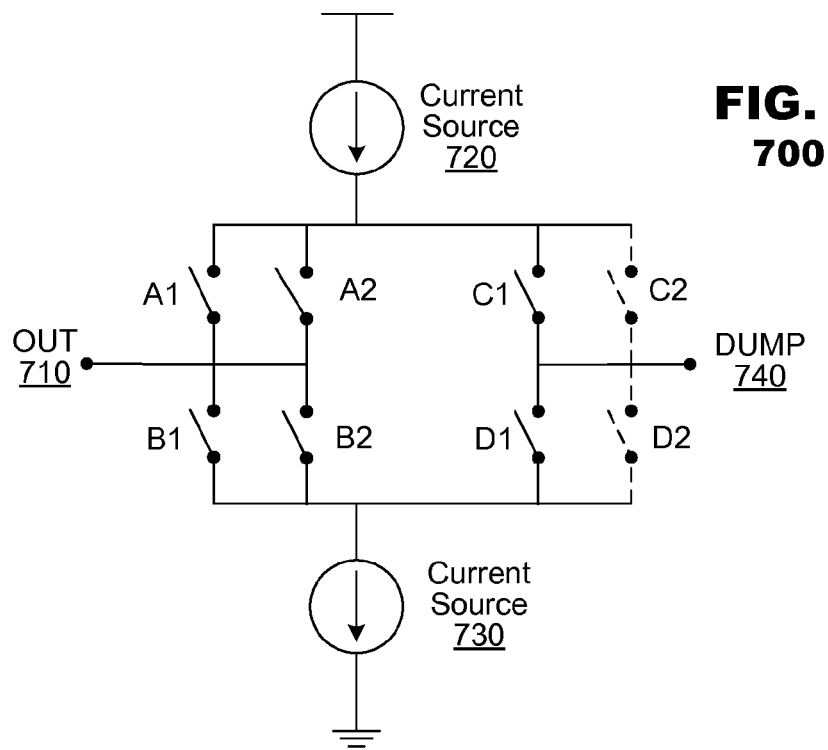
FIG. 7 illustrates a circuit for a switching scheme to control current sources in a tri-level unit element having a single output according to another embodiment of the present invention.

FIG. 7 illustrates a circuit for a switching scheme to control current sources in a tri-level unit element 700 having a single output according to another embodiment of the present invention. The tri-level unit element 700 may include a plurality of switches A1, A2, B1, B2, C1, C2, D1 and D2, output terminal 710, a pair of current sources 720 and 730, and a current dump node 740. The switches may establish two circuit branches between each current source 720, 730. Switches A1, A2, B1 and B2 may define a first branch, established between the first current source 720, the output terminal 710 and the second current source 730. Switches C1, C2, D1 and D2 may define a second branch, established between the first current source 720, the current dump node 740 and the second current source 730.

The tri-level unit element 700 may provide three states of operation for the unit cell: 1) the cell 700 provides current to the output terminal 710, 2) the cell 700 drains current from the output terminal 710, and 3) the cell is inert—the cell 700 neither supplies current to nor drains current from output terminal 710. During operation, only one switch in the first branch may be closed at a time. Thus, if switch A1 is closed to connect the output terminal 710 to the current source 720, the switches A2, B1 and B2 each may be open. In the second branch, two switches may be closed at one time (e.g., switches C1 and D1 or switches C2 and D2) to connect the dump node 740 to the current source 720. While, one of the current sources is coupled to the output terminal 710, the other current source may be coupled to the dump node 740.

To mitigate ISI, the switches that are activated to couple the first and second current source 720 and 730 to the output 710 or the current source dump 740, are changed at each phase even if the state of the tri-level unit element 700 does not change in a subsequent phase. For example, switch A1 may be activated to couple the first current source 720 to the output 710 (while switches A2, B1 and B2 are deactivated) in the first phase and in the next phase, switch A2 may be activated to couple the first current source 720 to the output 710 (while switches A1, B1 and B2 are deactivated).

For at each phase, either the current source 720 or 730 which is coupled to the output is switched, due to the changing state of the tri-level unit element 700, or the activated switches are changed to couple the same current source to the output 710 via a different path using different switches, when the state of the tri-level unit element 700 remains the same in a subsequent phase. Because the switch source capacitance sees the same disturbance irrespective of the transition state of the current sources 720, 730, the data dependence of the kickback is removed, thus, mitigating for ISI.

Figure 8:
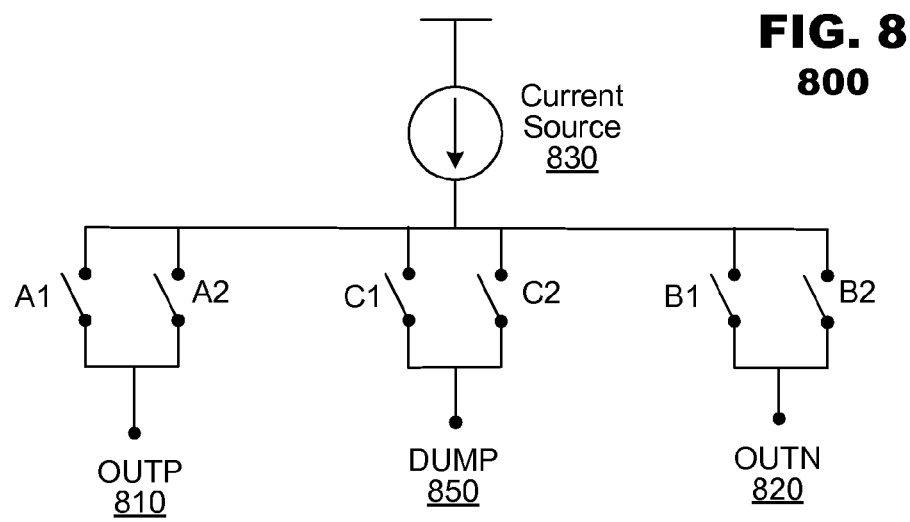
FIG. 8 illustrates a circuit for a switching scheme to control current sources in a tri-level unit element having a single current source according to another embodiment of the present invention.

FIG. 8 illustrates a circuit for a switching scheme to control current sources in a tri-level unit element 800 having a single current source according to another embodiment of the present invention. The tri-level unit element 800 may include a plurality of switches A1, A2, B1, B2, C1 and C2, output terminals 810, 820, a current source 830, and a current dump node 850. The switches may establish three circuit branches between the current source and one of the outputs 810, 820 and the current dump node 850. Switches A1 and A2 may define a first branch, established between the current source 830 and the output terminal 810. Switches B1 and B2 may define a second branch, established between the current source 830 and the output terminal 820. Switches C1 and C2 may define a third branch, established between the current source 830 and the current dump node 850.

The tri-level unit element 800 may provide three states of operation for the unit cell: 1) the cell 800 provides current to the output terminal 810, 2) the cell 800 provides current to the output terminal 820, and 3) the cell is inert—the current source 830 is coupled to the current dump node 850 and does not supply current to the outputs 810, 820. The current source 830 may be configured to provide a positive current or negative current to the outputs 810, 820. For example, the current source 830 may provide a current having a positive value when the current source 830 is coupled to the output 810 and may provide a current having a negative value when the current source 830 is coupled to the output 820.

During operation, only one switch in any of the three branches may be closed at a time. Thus, if switch A1 is closed to connect the output terminal 810 to the current source 830, the switches A2, B1, B2, C1 and C2 each may be open.

To mitigate ISI, the switches that are activated to couple the current source 830 to the outputs 810, 820 or the current source dump 850, are changed at each phase even if the state of the tri-level unit element 800 does not change in a subsequent phase. For example, switch A1 may be activated to couple the current source 830 to the output 810 (while switches A2, B1, B2, C1 and C2 are deactivated) in the first phase and in the next phase, switch A2 may be activated to couple the first current source 830 to the output 810 (while switches A1, B1, B2, C1 and C2 are deactivated).

Thus, for at each phase, either the output 810 or 820 which is coupled to current source 830 is switched, due to the changing state of the tri-level unit element 800, or the activated switches are changed to couple the current source 830 to the same output 810 or 820 via a different path using different switches, when the state of the tri-level unit element 800 remains the same in a subsequent phase. Because the switch source capacitance sees the same disturbance irrespective of the transition state of the current source 830, the data dependence of the kickback is removed, thus, mitigating for ISI.

In the above description, for purposes of explanation, numerous specific details have been set forth in order to provide a thorough understanding of the inventive concepts. As part of this description, some structures and devices may have been shown in block diagram form in order to avoid obscuring the invention. Reference in the specification to "one embodiment" or "an embodiment" means that a particular feature, structure, or characteristic described in connection with the embodiment is included in at least one embodiment of the invention, and multiple references to "one embodiment" or "an embodiment" should not be understood as necessarily all referring to the same embodiment.

One or a plurality of the above illustrated operations of the methods described herein may be implemented in a computer program that may be stored on a storage medium having instructions to program a system to perform the operations. The storage medium may include, but is not limited to, any type of disk including floppy disks, optical disks, compact disk read-only memories (CD-ROMs), compact disk rewritable (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions. Other embodiments may be implemented as software modules executed by a programmable control device.

As used in any embodiment in the present disclosure, "circuitry" may comprise, for example, singly or in any combination, analog circuitry, digital circuitry, hardwired circuitry, programmable circuitry, state machine circuitry, and/or firmware that stores instructions executed by programmable circuitry. Also, in any embodiment herein, circuitry may be embodied as, and/or form part of, one or more integrated circuits.

Although the methods illustrated and described herein include series of steps, it will be appreciated that the different embodiments of the present disclosure are not limited by the illustrated ordering of steps, as some steps may occur in different orders, some concurrently with other steps apart from that shown and described herein. In addition, not all illustrated steps may be required to implement a methodology in accordance with the present invention. Moreover, it will be appreciated that the processes may be implemented in association with the apparatus and systems illustrated and described herein as well as in association with other systems not illustrated.

It will be appreciated that in the development of any actual implementation (as in any development project), numerous decisions must be made to achieve the developers' specific goals (e.g., compliance with system and business related constraints), and that these goals will vary from one implementation to another. It will also be appreciated that such development efforts might be complex and time consuming, but would nevertheless be a routine undertaking for those of ordinary skill in art having the benefit of this disclosure.

What is claimed is:

1. A tri-level unit element, comprising:
   a first current source;
   a second current source; and
   a plurality of switches arranged to form three circuit branches between the first and the second current source, wherein:
      the first circuit branch includes two switches connected in parallel between the first current source and a first output terminal and two switches connected in parallel between the second current source and the first output terminal,
      the second circuit branch includes two switches connected in parallel between the first current source and a second output terminal and two switches connected in parallel between the second current source and the second output terminal, and
      the third circuit branch includes switches to couple the first current source and the second current source to a dump node.

2. The tri-level unit element of claim 1, wherein the switches are one of a NMOS switch, a PMOS switch and a low voltage NMOS switch.

3. The tri-level unit element of claim 1, wherein only two switches are closed at a time and a different set of switches are closed at each cycle of operation.

4. The tri-level unit element of claim 1, wherein the third circuit branch includes two switches between the first current source and the dump node and two switches between the second current source and the dump node.

5. The tri-level unit element of claim 1, wherein the switches in the three circuit branches are operated to provide one of three states in each clock cycle, the states including:
   a first state in which the first current source provides current to the first output terminal and the second current source drains current from the second output terminal,
   a second state in which the first current source provides current to the second output terminal and the second current source drains from the first output terminal, and
   a third state in which the first and second current source are coupled to the dump node.

6. The tri-level unit element of claim 5, wherein in a subsequent cycle a different set of switches are activated regardless whether the state has changed, from the set of switches activated in a preceding cycle to provide one of the three states.

7. The tri-level unit element of claim 5, wherein a different set of switches are activated in a consecutive clock cycle, if the same current sources are coupled to the respective outputs in the consecutive clock cycle.

8. The tri-level unit element of claim 1, wherein:
   in each clock cycle, the switches in the three circuit branches are operated to provide current at the output terminals having a positive state, current at the output terminals having a negative state or no current at the output terminals; and
   a different set of switches are activated in each clock cycle from a set of switches activated in a preceding cycle.

9. A tri-level unit element, comprising:
   a first current source;
   a second current source;
   a plurality of switch paths connected between the first and the second current source, wherein:
      a first switch path includes two switches connected in parallel between the first current source and an output terminal and two other switches connected in parallel between the second current source and the output terminal, and
      the second switch path includes a plurality of switches between the first and second current sources and a dump node.

10. The tri-level unit element of claim 9, wherein the switches are one of a NMOS switch, a PMOS switch and a low voltage NMOS switch.

11. The tri-level unit element of claim 9, wherein in each clock cycle the first current source is coupled to the output terminal, the second current source is coupled to the output terminal or the first and second current sources are coupled to the dump node.

12. The tri-level unit element of claim 11, wherein a different switch is activated in a consecutive clock cycle, if the same current source is coupled to the output in the consecutive clock cycle.

13. The tri-level unit element of claim 11, wherein:
   when the first current source is coupled to the output terminal, the second current source is coupled to the dump node; and
   when the second current source is coupled to the output terminal, the first current source is coupled to the dump node.

14. A method for controlling switches in a tri-level unit element, comprising:
   receiving a signal representing a current state of the unit element;
   comparing the current state to a preceding state of the unit element;

if the state of the unit element changed, controlling the switches to change the state of the unit element;

if the state has not changed, controlling the switches to provide the same state of the unit element with a different set of switches being activated.

15. The method of claim 14, wherein the signal representing the current state of the unit element is a multi-bit signal representing one of a negative state, a positive state and an inert state.

16. The method of claim 14, wherein each of the current state and the preceding state include one of a positive state, a negative state and an inert state.

17. The method of claim 14, wherein two or more switches are controlled to provide one of a negative state, a positive state and an inert state.

18. A digital-to-analog converter, comprising:
a plurality of tri-level unit elements for converting digital data into an analog signal, each tri-level unit element including:
  a first current source,
  a second current source, and
  a plurality of switches arranged to form three circuit branches between the first and the second current source, wherein:
    the first circuit branch includes two switches connected in parallel between the first current source and a first output terminal and two switches connected in parallel between the second current source and the first output terminal,
    the second circuit branch includes two switches connected in parallel between the first current source and a second output terminal and two switches connected in parallel between the second current source and the second output terminal, and
    the third circuit branch includes switches to couple the first current source and the second current source to a dump node;
a driver circuit to control the contribution of each tri-level unit element to the analog signal based on the digital data; and
an adder for adding analog signals output from each of the tri-level unit elements.

19. The digital-to-analog converter of claim 18, wherein the switches in each of the tri-level unit elements are operated such that only two switches are closed in each clock cycle to couple the first current source to one of the first output terminal, the second output terminal and the dump node and to couple the second current source to one of the first output terminal, the second output terminal and the dump node.

20. The digital-to-analog converter of claim 18, wherein in each tri-level unit element:
the switches in the three circuit branches are operated to provide one of three states in each clock cycle; and
a different set of switches is activated in a consecutive clock cycle, if the same set of switches is used in the consecutive clock cycle.

21. A tri-level unit element, comprising:
a current source; and
a plurality of switches arranged to form three circuit branches connected to the current source, wherein:
  the first circuit branch includes two switches connected in parallel between the current source and a first output terminal,
  the second circuit branch includes two switches connected in parallel between the current source and a second output terminal, and
  the third circuit branch includes switches to couple the current source to a dump node.

22. The tri-level unit element of claim 21, wherein the switches are one of a NMOS switch, a PMOS switch and a low voltage NMOS switch.

23. The tri-level unit element of claim 21, wherein only two switches are closed at a time and a different set of switches are closed at each cycle of operation.

24. The tri-level unit element of claim 21, wherein the third circuit branch includes two switches between the current source and the dump node.

25. The tri-level unit element of claim 21, wherein the switches in the three circuit branches are operated to provide one of three states in each clock cycle, the states including:
a first state in which the current source provides current to the first output terminal,
a second state in which the current source provides current to the second output terminal, and
a third state in which the current source is coupled to the dump node.

26. The tri-level unit element of claim 25, wherein in a subsequent cycle a different set of switches are activated regardless whether the state has changed, from the set of switches activated in a preceding cycle to provide one of the three states.

27. The tri-level unit element of claim 25, wherein a different set of switches are activated in a consecutive clock cycle, if the current source is coupled to the respective outputs in the consecutive clock cycle.

28. The tri-level unit element of claim 21, wherein:
in each clock cycle, the switches in the three circuit branches are operated to provide current at the output terminals having a positive state, current at the output terminals having a negative state or no current at the output terminals; and
a different set of switches are activated in each clock cycle from a set of switches activated in a preceding cycle.

* * * * *